United States Patent
Miyake et al.

(10) Patent No.: US 6,274,225 B1
(45) Date of Patent: Aug. 14, 2001

(54) CIRCUIT MEMBER AND CIRCUIT BOARD

(75) Inventors: Yasufumi Miyake; Tetsuya Terada; Kenkichi Yagura; Chiharu Miyaake; Toshihiko Sugimoto, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/424,776

(22) Filed: Nov. 30, 1999

(51) Int. Cl.$^7$ ................................................. B32B 3/00
(52) U.S. Cl. ........................ 428/209; 174/254; 174/258; 174/259
(58) Field of Search .................... 428/209, 901; 174/250, 254, 258, 259

(56) References Cited

U.S. PATENT DOCUMENTS

| | | | |
|---|---|---|---|
| 3,896,076 | * 7/1975 | Watanabe et al. | 260/40 R |
| 3,932,689 | * 1/1976 | Watanabe et al. | 428/418 |
| 3,962,520 | * 6/1976 | Watanabe et al. | 428/414 |
| 4,477,636 | * 10/1984 | Muroi et al. | 522/27 |
| 6,001,489 | * 10/1999 | Miyaake et al. | 428/458 |

FOREIGN PATENT DOCUMENTS

| | | |
|---|---|---|
| 50-16866 | 2/1975 | (JP). |
| 62-93991 | 4/1987 | (JP). |
| 6-21594 | 1/1994 | (JP). |
| 8-130368 | 5/1996 | (JP). |

* cited by examiner

*Primary Examiner*—Cathy Lam
(74) *Attorney, Agent, or Firm*—McGuireWoods, LLP (57) ABSTRACT

The present invention provides a rigid circuit member obtained by bending a composite laminate comprising a circuit conductor made of a metal foil interposed between plastic films having an elastic modulus of not less than 450 kg/mm$^2$ with an adhesive, characterized in that as said plastic film there is used a polyethylene naphthalate film. The present invention also provides a circuit board adapted to be connected to a conductor on a rigid substrate, characterized in that said circuit conductor is interposed between polyethylene naphthalate films. The present invention further provides a printed circuit board, comprising a polyethylene naphthalate film having an elastic modulus of not less than 500 kg/mm$^2$, not more than $1.5\times10^{-5}$/° C., a hygroscopic expansion coefficient of not more than $1.2\times10^{-5}$/%RH, a water vapor permeability of not more than 15 g/m$^2$/mil day, a percent water absorption of not more than 2% and a melting point of not higher than 280° C. and a conductor circuit integrated into a laminate with an adhesive layer provided interposed therebetween.

7 Claims, 2 Drawing Sheets

CIRCUIT MEMBER AND CIRCUIT BOARD

TECHNICAL FIELD

The present invention relates to a self-shape retaining rigid circuit member which has been bent into a predetermined shape.

The present invention also relates to a circuit board adapted to be connected to a rigid substrate having a conductor printed thereon, e.g., glass substrate having a transparent electrode printed thereon.

The present invention further relates to a printed circuit board, particularly a flexible printed circuit board, as a functional part mainly for use in the art of electric and electronic apparatus.

BACKGROUND TECHNIQUE

As a circuit member in electric and electronic apparatus there is normally used a flexible circuit board. In some cases, a self-shape retaining circuit member obtained by bending a rigid circuit board into a predetermined shape may be used.

For example, as a circuit member provided between a battery and an apparatus driving portion there has heretofore been used a flexible printed circuit board. It has been a common practice that a metal tab as a contact point to apparatus is mounted on the terminal of the flexible circuit substrate on which electronic parts are mounted and the metal tab is connected to the apparatus driving portion. However, the mounting of the metal tab on the flexible circuit board can cause thermal shock that deteriorates the reliability of the circuit board. In recent years, an attempt has been made to use a self-shape retaining circuit board obtained by stamping a conductor circuit integrated with a metal tab out of a metal foil, interposing the circuit board between rigid plastic films with an adhesive layer to form a composite laminate, and then bending the composite laminate under press.

Such a self-shape retaining circuit member needs to comprise a tough rigid plastic film, i.e., plastic film having an elastic modulus of not less than 450 kg/mm to withstand press molding and assure stable self-shape retention.

As well known, when heated, a plastic film tends to shrink due to residual stress or recrystallization during film forming.

A circuit member is a composite of a metal foil with a plastic film. Assuming that the percent thermal shrinkage, elastic modulus and thickness of the plastic film are $\zeta$, $Ep$ and $tp$, respectively, and the elastic modulus and thickness of the metal foil are $Em$ and $tm$, respectively, the percent thermal shrinkage $X$ of the circuit member is given by the following equation:

$$X=\zeta/(1+Em \cdot tm/Ep \cdot tp)$$

Since a conventional flexible printed circuit board comprises a plastic film having a small elastic modulus of $Ep$ and a small thickness of $tp$, its entire percent thermal shrinkage is small as evident from the foregoing equation.

However, the foregoing self-shape retaining circuit member needs to comprise a rigid plastic film having a high elastic modulus and a large thickness of $tp$ to withstand press molding and assure stable self-shape retention. Thus, $Ep$ and $tp$ cannot be reduced, and the resulting X value is increased. Therefore, the thermal expansion and shrinkage of the foregoing self-shape retaining circuit board itself cannot be neglected. The resulting thermal stress can break the point at which it is connected to apparatus or battery or the point on which an electronic part is mounted. Accordingly, assured excellent reliability can hardly be given to the foregoing self-shape retaining circuit member under severe thermal conditions.

It is therefore a first object of the present invention to provide a self-shape retaining rigid circuit member shaped into a predetermined shape by bending under press, which exhibits assured press-moldability and self-shape retention as well as assured reliability against severe thermal use.

In the assembly of electric and electronic apparatus, the connection of a circuit portion comprising a rigid circuit board to other circuit portions or power supply may be made via a flexible circuit board.

As such a flexible circuit board there has heretofore been normally used one comprising a polyethylene terephthalate film or polyimide film as a substrate or cover.

The connection of a rigid circuit board to a flexible circuit board has traditionally been accomplished by soldering. In recent years, in order to meet the demand for high precision in conductor on circuit board, it has been attempted to use an anisotropic electrically-conductive film.

An attempt has been made as follows. In some detail, an anisotropic electrically-conductive film, which comprises a film-shaped adhesive having a thickness of scores of microns and containing electrically-conductive particles incorporated therein such that both ends of the particle are exposed out of both sides of the film and the adhesive is interposed among the particles, is interposed between surfaces to be connected. The laminate is then heated under pressure so that the film-shaped adhesive undergoes flow deformation to connect the conductors on the surfaces to be connected through the electrically-conductive particles and fill the gap between the surfaces to be connected with the adhesive.

This connection process makes it possible to connect high precision circuits having, e.g., 20 conductors per mm, that is, conductor pitch of 50 $\mu$m.

In the case where two members a, b are superposed and connected to each other as mentioned above, if the two members a, b shrink at different expansion and shrinkage rates, stress is produced at the interface of the two members. In this case, taking the expansion and shrinkage rate, thickness and Young's modulus of the member a as $Ka$, $Ta$ and $Ea$, respectively, and taking the expansion and shrinkage rate, thickness and Young's modulus of the member b as $Kb$, $Tb$ and $Eb$, respectively, the resulting X is given by the following equation (1):

$$X=(Ka-Kb)/[1/(Ta \cdot Ea)+1/(Tb \cdot Eb)] \quad (1)$$

In order to reduce ($Ka-Kb$) in the equation (1) and hence reduce the resulting thermal stress with respect to heat cycle applied to the point at which the foregoing glass circuit board b and plastic flexible circuit board a are connected, a plastic substrate having a small thermal expansion coefficient can be used for the flexible circuit board to advantage.

A plastic expands or shrinks either when it absorbs moisture or it drys. Thus, stress is generated at the foregoing connecting portion either when the plastic substrate in the flexible circuit board absorbs moisture or it drys as evident from the equation (1)

Fatigue failure of the connecting portion on circuit board due to stress caused by thermal expansion and shrinkage has heretofore been considered problematical. However, stress caused by moisture absorption or drying has not too much been considered problematical from the standpoint of fatigue failure.

However, if the glass circuit board exhibits substantially zero hygroscopic and drying expansion and shrinkage rate and the rigid circuit board is such a glass circuit board, assuming that Kb in the equation (1), which is the hygroscopic and drying expansion and shrinkage rate of the glass circuit board, is 0 and Ka is the hygroscopic and drying expansion rate of the plastic flexible circuit board, the resulting stress Y is given by the following equation (2):

$$Y=Ka/[1/(Ta \cdot Ea)+1/(Tb \cdot Eb)] \tag{2}$$

Thus, the hygroscopic and drying expansion and shrinkage rate Ka of the plastic flexible circuit board is straightly reflected in the stress. The resulting stress cannot be neglected. The fatigue and damage caused by the stress cannot be neglected.

Among the foregoing flexible circuit boards, the circuit board comprising a polyethylene terephthalate film as a substrate exhibits a high thermal expansion and shrinkage rate and thus is not appropriate from the standpoint of prevention of fatigue and damage on the foregoing connecting portion due to stress. The circuit board comprising a polyimide film as a substrate exhibits a small thermal expansion rate but a high hygroscopic and drying expansion and shrinkage rate and thus is not appropriate from the standpoint of prevention of fatigue and damage on the foregoing connecting portion due to stress.

It is therefore a second object of the present invention to provide a plastic circuit board adapted to be superposed on and connected to the terminal of a circuit board having a substantially zero hygroscopic and drying expansion and shrinkage rate such as glass substrate, which comprises a plastic substrate that is appropriate for the prevention of fatigue and damage due to stress on the connecting portion, taking into account the fact that not only thermal expansion and shrinkage rate but also hygroscopic and drying expansion and shrinkage rate take great part in fatigue and damage on the connecting portion.

Further, electric and electronic apparatus comprise many printed circuit boards incorporated therein. A printed circuit board is formed by integrating an electrical insulating substrate film and a conductor circuit with an adhesive into a laminate. In general, it is formed by laminating two sheets of substrate films with a conductor circuit provided interposed therebetween with an adhesive. Alternatively, it may be formed by alternatingly laminating a plurality of conductor circuits and a plurality of substrate films with an adhesive provided interposed therebetween.

As such a substrate film there has heretofore been often used a polyethylene terephthalate film or polyimide film.

In recent years, electronics has made remarkable progress. With the enhancement of the density of electric and electronic apparatus and the reduction of the size, thickness and weight of electric and electronic apparatus, printed circuit boards having higher density have been required for these apparatus, and the enhancement of the dimensional stability of circuit pattern has been keenly desired more and more. In particular, under high humidity conditions, printed circuit boards absorb water to show a dimensional change that impairs its connection to other electronic parts such as connector. Thus, the enhancement of the reliability of printed circuit boards against humidity has been desired.

Further, in order to assist global environmental protection, it has been required to recycle resources from printed circuit boards, too.

In order to meet the foregoing requirements for dimensional stability and humidity reliability of printed circuit boards and recyclability of materials from circuit boards, it is necessary that an optimum substrate film and adhesive composition be selected to design printed circuit board. The process for design of such printed circuit boards needs to involve due consideration of various physical properties of the substrate film, occasionally the effect of the composition of the adhesive on the properties of the printed circuit board. In particular, the optimization of physical properties of the substrate film is important for the satisfaction of the requirements for printed circuit boards.

However, none of polyimide films or polyethylene terephthalate films which have been used as substrate films can satisfy all the requirements for printed circuit boards. Further, JP-A-8-130368 (The term "JP-A" as used herein means an "unexamined published Japanese patent application") proposes the use of a polyethylene naphthalate film as a substrate film. However, an ordinary polyethylene naphthalate film is disadvantageous in that it exhibits physical properties close to that of polyethylene terephthalate film and thus shows a great dimensional change under high temperature conditions.

The inventors noted that the film to be used as a substrate needs to exhibit a high elastic modulus and a small thermal expansion coefficient in order to give a good dimensional stability under high temperature conditions during the production and actual use of printed circuit board, needs to exhibit a small hygroscopic expansion coefficient, a small water vapor permeability and a small percent water absorption in order to give a high dimensional stability even under high humidity conditions and needs to exhibit a low melting point in order that the conductor circuit can be easily separated by heating and melting the substrate film when the materials are recycled from waste printed circuit boards.

Then, the inventors made extensive studies of the effect of the physical properties of various substrate film materials on the properties of printed circuit boards. As a result, it was found that a polyethylene naphthalate film having an elastic modulus of not less than 500 kg/mm², thermal expansion coefficient of not more than $1.5 \times 10^{-5}$/° C., a hygroscopic expansion coefficient of not more than $1.2 \times 10^{-5}$/%RH, a water vapor permeability of not more than 15 g/m²/mil·day, a percent water absorption of not more than 2% and a melting point of not higher than 280° C. is optimum as a substrate film for printed circuit board. Thus, the present invention has been worked out.

It is therefore a third object of the present invention to provide a printed circuit board comprising the foregoing specific polyethylene naphthalate film.

DISCLOSURE OF THE INVENTION

The foregoing objects of the present invention are accomplished by the following first to third embodiments of the present invention.

The first embodiment of the present invention concerns a circuit member obtained by bending a composite laminate comprising a circuit conductor made of a metal foil interposed between plastic films having an elastic modulus of not less than 450 kg/mm² with an adhesive, wherein a polyethylene naphthalate film is used as the plastic film.

The second embodiment of the present invention concerns a circuit board adapted to be connected to a conductor on a rigid substrate, wherein said circuit conductor is interposed between polyethylene naphthalate films.

The third embodiment of the present invention concerns a printed circuit board, in which a polyethylene naphthalate film having an elastic modulus of not less than 500 kg/mm², a thermal expansion coefficient of not more than $1.5 \times 10^{-5}$/° C., a hygroscopic expansion coefficient of not more than $1.2 \times 10^{-5}$/%RH, a water vapor permeability of not more than 15 g/m²/mil·day, a percent water absorption of not more than 2% and a melting point of not higher than 280° C. and a conductor circuit are integrated into a laminate with an adhesive layer provided interposed therebetween.

BEST MODE FOR CARRYING OUT THE INVENTION

1. Rigid Circuit Member According to the First Embodiment

The first embodiment of the present invention will be further described in connection with the accompanying drawings.

Figure 1A:
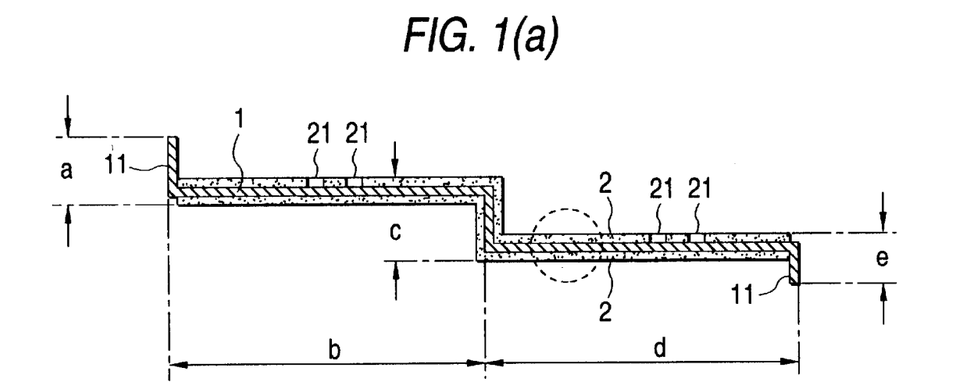
FIG. 1(a) is a diagram illustrating a rigid circuit member according to the first embodiment of the present invention.
Figure 1B:
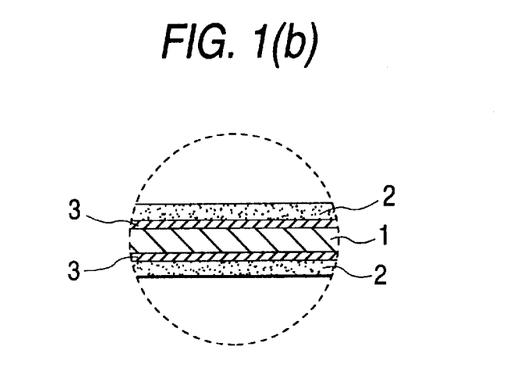
FIG. 1(b) is an enlarged view of the section surrounded by the broken line in FIG. 1(a)

FIG. 1(a) illustrates a rigid circuit member according to the present invention having a predetermined shape obtained by bending under press. FIG. 1(b) is an enlarged view of the section surrounded by the broken line in FIG. 1(b).

In FIGS. 1(a) and (b), the reference numeral 1 indicates a circuit conductor made of a metal foil having a predetermined pattern. The circuit conductor 1 has a tab 11 integrated thereinto at both ends thereof. The reference numeral 2 indicates a polyethylene naphthalate film stuck to the both sides of the circuit conductor 1 with an adhesive 3. The reference numeral 21 indicates an optional hole for soldering electronic parts. The polyethylene naphthalate film 2 is made of a polymer of naphthalene (2,6) dicarboxylic acid with ethylene glycol. It can be produced by melt extrusion technique. This film is as rigid as to exhibit an elastic modulus of about 550 kg/mm and as heat-resistant as to exhibit a glass transition point of about 120° C.

In order to produce a circuit member according to the first embodiment of the present invention, the following method is used. In some detail, a circuit conductor is formed by stamping a predetermined circuit pattern out of a metal foil or boring a predetermined circuit pattern in a wire. A solvent solution of a thermoplastic or thermo-setting adhesive is applied to one side of a polyethylene naphthalate film, and then dried to provide an adhesive layer thereon. The circuit conductor is then provided interposed between two sheets of the polyethylene naphthalate films in such an arrangement that the adhesive layer is positioned inside. The lamination is then effected by the use of a heat press, heat roll or the like. Thereafter, the laminate is trimmed into a predetermined profile. The laminate thus trimmed is then bent into a predetermined shape under press to finish the production of the present circuit member.

In this production example, the lamination of the two sheets of polyethylene naphthalate films is effected at the same time. However, it may be effected separately at separate steps.

In order to produce a circuit member according to the first embodiment of the present invention, the following method is used. In some detail, one sheet of the polyethylene naphthalate film is stuck to one side of a metal foil with the foregoing adhesive layer provided interposed therebetween. The metal foil is then etched with a chemical agent to form a circuit conductor having a predetermined pattern thereon. Thereafter, the other sheet of the polyethylene naphthalate film is stuck to the other side of the metal foil with the foregoing adhesive layer provided interposed therebetween. Thereafter, the laminate is trimmed into a predetermined profile. The laminate thus trimmed may then be bent into a predetermined shape under press.

As the metal foil for the foregoing circuit conductor there may be used an electrically-conductive metal such as nickel, iron, SUS, copper, aluminum and phosphor bronze, alloy thereof or a metal foil having such a metal plated or evaporated. The thickness of the metal foil is from 10 to 1,000 $\mu$m, preferably from 20 to 500 $\mu$m in terms of the lamination with the polyethylene naphthalate film.

Examples of the adhesive employable herein include epoxy resin, ethylene-acrylate copolymer, polyamide, polyester, polyvinyl butyral, polybutadiene rubber, acrylonitrile-butadiene rubber, carboxyl-modified acrylonitrile-butadiene rubber, acryl rubber, and silicone rubber. One or more of these adhesives may be used.

Alternatively, the ingredients (A) to (D) described further later with reference to the third embodiment may be used as adhesive.

The adhesive may selectively comprise as a reaction accelerator or crosslinking agent a phenol resin, isocyanate resin, amine, acid anhydride, melamine resin, peroxide, organic metal oxide or phosphor compound incorporated therein. The adhesive may further selectively comprise a flame retardant, heat-resisting agent, heat conduction improver or coupling agent incorporated therein.

The rigid circuit member according to the first embodiment of the present invention can be incorporated in electric and electronic apparatus. For example, it may be used as an electric circuit between battery and driving portion in electric and electronic apparatus. The both terminals of the rigid circuit member are electrically connected by soldering and the like to the batter and the driving portion, respectively. Electronic parts are soldered to the circuit board at the foregoing holes for soldering electronic parts.

The circuit member according to the first embodiment of the present invention comprises a tough polyethylene naphthalate film as a plastic film substrate and thus can be bent under press safely without fracture or break.

Further, the rigidity of the polyethylene naphthalate film is as high as about 550 kg/mm in terms of elastic modulus. Thus, the polyethylene naphthalate film can stably retain its bent against its weight.

Further, because of the rigidity of molecular chain in its molecular structure and other factors, the polyethylene naphthalate film exhibits an extremely small thermal shrinkage rate $\zeta$ and thus can restrict the thermal shrinkage rate of the circuit member represented by the foregoing equation (1) to a very small value even under severe thermal working conditions (Consumers' electric and electronic apparatus which are used under severe working conditions need to withstand 80° C. for 1,000 hours). Thus, the generation of stress at the foregoing soldering point can be fairly inhibited, making it possible to fairly assure the reliability of the soldering point under severe thermal working conditions.

In particular, because of its marked toughness, the polyethylene naphthalate film, even if its thickness is as very small as 1 mil (25 μm), can withstand pressing. Also by reducing tp in the equation (1), the thermal shrinkage rate X of the circuit member can be reduced. Thus, the reliability of the heat resistance of the soldering point can be further enhanced. Further, the precision in bending can be enhanced.

The bent shape of the circuit member according to the first embodiment of the present invention is not limited to that shown in FIG. 1. It goes without saying that the circuit member can be bent into a proper shape depending on how it is used.

The inventors confirmed that in a flat circuit member comprising a circuit conductor made of a metal foil provided interposed between plastic films with an adhesive, the use of a plastic film which meets specific requirements, i.e., an elastic modulus of not less than 450 kg/mm, a thermal expansion coefficient of not more than 15 ppm/° C., a hygroscopic expansion coefficient of not more than 12 ppm/%RH and a water vapor permeability of not more than 15 g/m²/mil·day makes it possible to fairly inhibit bending caused by thermal stress. A polyethylene naphthalate meets all these requirements and thus can exhibit a stable shape retention even under severer bending conditions caused by thermal stress.

2. Circuit Board According to the Second Embodiment

The second embodiment of the present invention will be further described hereinafter in connection with the accompanying drawings.

Figure 2:
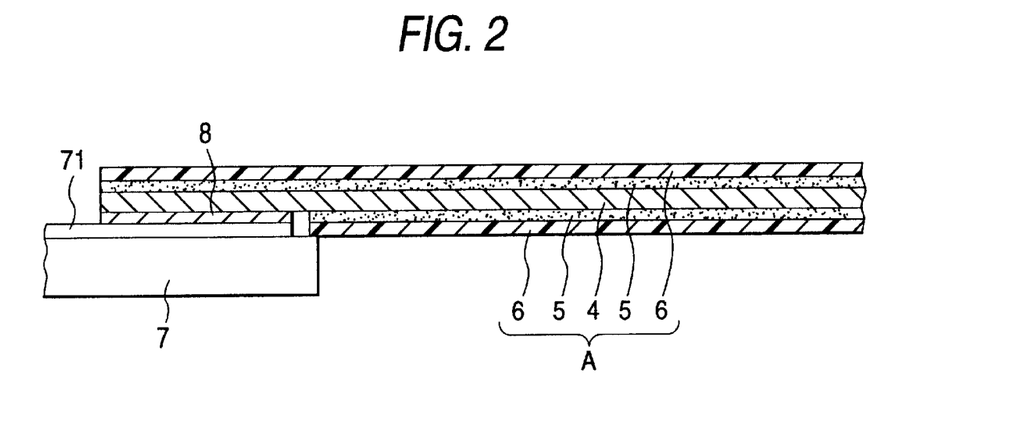
FIG. 2 is a diagram illustrating a circuit board according to the second embodiment of the present invention.

The circuit board according to the second embodiment of the present invention is adapted to be connected to a rigid substrate such as inorganic substrate at at least one end thereof. FIG. 2 is a diagram illustrating how it is used.

In FIG. 2, the symbol A indicates a circuit board according to the second embodiment comprising a circuit conductor 4 interposed between polyethylene naphthalate films 6, 6 with adhesives 5. The reference numeral 7 indicates a rigid substrate such as glass substrate having a liquid crystal module with a transparent electrode 71 printed thereon. The circuit board A according to the present invention is connected to the transparent electrode on the glass substrate at one thereof via an anisotropic electrically-conductive film 8 as previously mentioned.

As the foregoing polyethylene naphthalate film there may be used a film of a polymer of naphthalene (2, 6) dicarboxylic acid with ethylene glycol. It can be produced by melt extrusion technique. This film is as rigid as to exhibit an elastic modulus of about 550 kg/mm and as heat resistant as to exhibit a glass transition point of about 120° C.

As the polyethylene naphthalate film to be used in the second embodiment of the present invention there is preferably used one having an elastic modulus of not less than 450 kg/mm, a thermal expansion coefficient of not more than 15 ppm/° C., a hygroscopic expansion coefficient of not more than 12 ppm/%RH, a water vapor permeability of not more than 15 g/m²/mil·day, a percent water absorption of not more than 2% and a softening point of not higher than 250° C.

As the foregoing rigid substrate there is preferably used a glass substrate or glass epoxy substrate. Alternatively, a metal plate may be used. These rigid substrates exhibit substantially zero hygroscopic and drying expansion and shrinkage.

Taking the thickness and Young's modulus of the rigid substrate as Tb and Eb, respectively, and taking the hygroscopic and drying expansion and shrinkage rate, thickness and Young's modulus of the circuit board according to the present invention as Ka, Ta and Ea, respectively, the stress Y applied to the interface of the foregoing connecting portion when the connecting portion is exposed to hygroscopic and drying atmosphere is given by the following equation (3):

$$Y = Ka / [1/(Ta \cdot Ea) + 1/(Tb \cdot Eb)] \quad (3)$$

Taking the thermal expansion and shrinkage rate of the rigid substrate and the circuit board according to the second embodiment of the present invention as Kb and Ka, respectively, the stress X applied to the interface of the foregoing connecting portion when the connecting portion is exposed to heating and cooling atmosphere is given by the following equation (4):

$$X = (Ka - Kb) / [1/(Ta \cdot Ea) + 1/(Tb \cdot Eb)] \quad (4)$$

A polyethylene naphthalate exhibits a hygroscopic expansion rate as extremely small as not more than 12 ppm/%R, a water vapor permeability as extremely small as not more than 15 g/m²/mil·day and a percent water absorption as extremely small as not more than 2%. Thus, the circuit board according to the present invention, which is a composite of a polyethylene naphthalate film with a circuit board, exhibits an extremely small hygroscopic and drying expansion and shrinkage rate Ka and thus can undergoes a sufficiently low stress Y as represented by the equation (3).

Further, a polyethylene naphthalate exhibits a low thermal expansion and shrinkage rate due to the rigidity of molecular chain in its molecular structure. Thus, the circuit board according to the present invention, which is a composite of a polyethylene naphthalate film with a circuit board, exhibits an extremely small thermal expansion and shrinkage rate Ka and thus can undergoes a sufficiently low stress X as represented by the equation (2).

Accordingly, the circuit board according to the second embodiment of the present invention adapted to be connected to a rigid circuit board undergoes reduced fatigue and damage caused by stress applied to the connecting portion and thus gives assured wiring excellent in reliability.

Further, the circuit board according to the second embodiment of the present invention exhibits a melting point as low as 200° C. Thus, the polyethylene naphthalate film can be melted before discarded so that the conductor material can be recovered. Thus, the circuit board according to the second embodiment of the present invention can be disposed of at a low energy (2.5×10 KJ/rg) without producing any harmful gas (nitrogen oxide in the case of polyimide). Moreover, the circuit board according to the second embodiment of the present invention is also advantageous in that polyethylene naphthalate exhibits a high glass transition point (polyethylene naphthalate exhibits a glass transition point of about 120° C. as compared with polyethylene terephthalate, which exhibits a glass transition point of about 80° C.) and hence an excellent heat resistance.

In order to produce the circuit board according to the second embodiment of the present invention, the following method may be used. In some detail, a circuit conductor is formed by stamping a predetermined circuit pattern out of a metal foil or boring a predetermined circuit pattern in a wire. A solvent solution of a thermoplastic or thermo-setting adhesive is applied to one side of a polyethylene naphthalate film, and then dried to provide an adhesive layer thereon. The circuit conductor is then provided interposed between two sheets of the polyethylene naphthalate films in such an arrangement that the adhesive layer is positioned inside. The lamination is then effected by the use of a heat press, heat roll or the like. Thereafter, the laminate is trimmed into a predetermined profile. The laminate thus trimmed is then bent into a predetermined shape under press to finish the production of the present circuit board.

In this production example, the lamination of the two sheets of polyethylene naphthalate films is effected at the same time. However, it may be effected separately at separate steps.

Besides these production methods, another method may be used. In some detail, one sheet of the polyethylene naphthalate film is stuck to one side of the metal foil with the foregoing adhesive layer interposed therebetween. An etching resist is then formed on the metal foil in a pattern according to the circuit pattern. The metal foil is then etched with a chemical agent to form a circuit conductor. Thereafter, the other sheet of the polyethylene naphthalate film is stuck to the circuit conductor side of the laminate with the foregoing adhesive layer interposed therebetween. Thereafter, the laminate may be trimmed into a predetermined profile.

Similarly to the first embodiment of the present invention, as the metal foil for the foregoing circuit conductor there may be used an electrically-conductive metal such as nickel, iron, SUS, copper, aluminum, phosphor bronze and beryllium bronze, alloy thereof or a metal foil having such a metal plated or evaporated. The thickness of the metal foil is from 10 to 1,000 $\mu$m, preferably from 20 to 500 $\mu$m, in terms of the lamination with the polyethylene naphthalate film.

Similarly to the first embodiment of the present invention, examples of the foregoing adhesive include epoxy resin, ethylene-acrylate copolymer, polyamide, polyester, polyvinyl butyral, polybutadiene rubber, acrylonitrile-butadiene rubber, carboxyl-modified acrylonitrile-butadiene rubber, acryl rubber, and silicone rubber. One or more of these adhesives may be used.

Alternatively, the ingredients (A) to (D) described further later with reference to the third embodiment may be used as adhesive.

Similarly to the first embodiment of the present invention, the adhesive may selectively comprise as a reaction accelerator or crosslinking agent a phenol resin, isocyanate resin, amine, acid anhydride, melamine resin, peroxide, organic metal oxide or phosphor compound. The adhesive may further selectively comprise a flame retardant, heat-resisting agent, heat conduction improver or coupling agent.

In the circuit board according to the second embodiment of the present invention, holes for mounting electronic parts may be provided in the polyethylene naphthalate film so that electronic parts can be soldered to the conductor at these holes. In this case, it is preferred that holes for mounting electronic parts be previously made in the polyethylene naphthalate film before lamination with the conductor with an adhesive. The conductor may be subjected to surface treatment such as plating at the holes before the laminate thus formed is trimmed.

The circuit board according to the second embodiment of the present invention may preferably comprise a circuit member according to the first embodiment of the present invention.

3. Printed Circuit Board According to the Third Embodiment

The third embodiment of the present invention will be further described hereinafter.

In the third embodiment of the present invention, the foregoing physical properties of the polyethylene naphthalate film were measured by the following test methods.

Elastic Modulus

The test was effected in accordance with ASTM-D-882-88.

Thermal Expansion Coefficient

The test was effected in accordance with ASTM-D-696.

Hygroscopic Expansion Coefficient

Firstly, a film specimen having two reference points provided thereon is allowed to stand at a temperature of 23° C. and a relative humidity of 20% for 1 hour. The distance between the two reference points is then measured by means of a microscope with scale to a precision of $\mu$m ($L_1$). The film specimen is then allowed to stand at a temperature of 23° C. and a relative humidity of 80% for 1 hour. The distance between the two reference points is then accurately measured by means of the microscope with scale to a precision of $\mu$m ($L_2$). The hygroscopic expansion coefficient ($\alpha_H$) is then calculated by the following equation (1):

$$\alpha_H = (L_2 - L_1)/60/L_1 \tag{1}$$

Water Vapor Permeability

The test was effected in accordance with ASTM-D-96.

Percent Water Absorption

The test was effected in accordance with ASTM-D-570.

Melting Point

The test was effected by microscopy.

Figure 3:
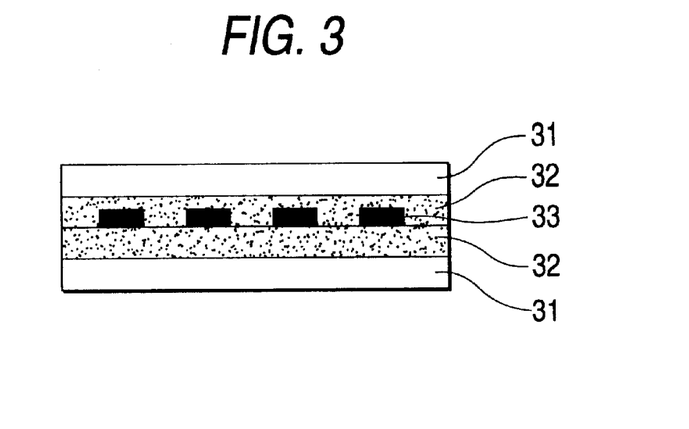
FIG. 3 is a sectional view illustrating the structure of a printed circuit board according to the third embodiment of the present invention.
Figure 4:
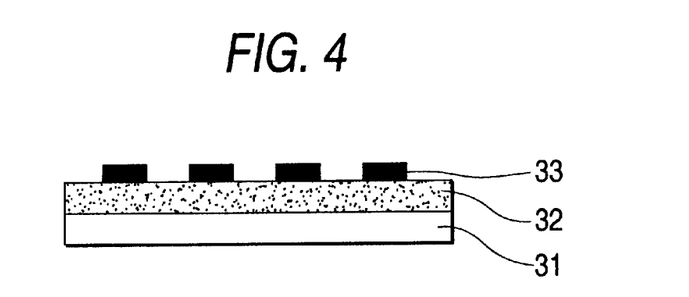
FIG. 4 is a sectional view illustrating the structure of a printed circuit board according to the third embodiment of the present invention comprising one sheet of a substrate film.
Figure 5:
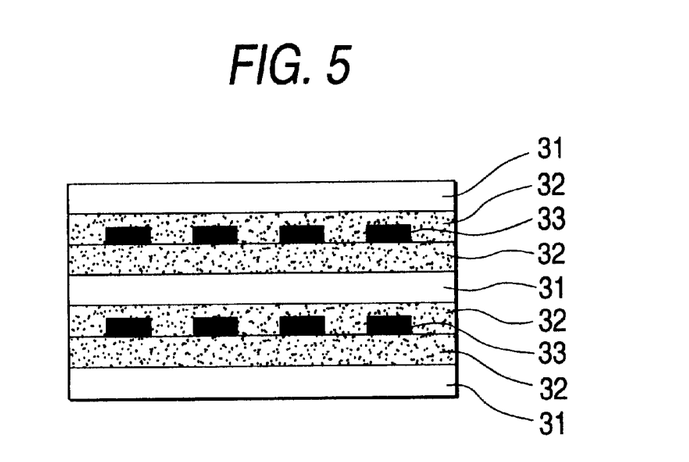
FIG. 5 is a sectional view illustrating the structure of a multi-layer printed circuit board according to the third embodiment of the present invention.

Examples of the present invention will be described in connection with the accompanying drawings. FIGS. 3 and 4 illustrate basic implementation of the third embodiment of the present invention. In these drawings, the reference numeral 31 indicates a substrate film, the reference numeral 32 indicates an adhesive, and the reference numeral 33 indicates a conductor circuit. FIG. 5 illustrates how the third embodiment of the present invention is applied to a multi-layer circuit board. In these drawings, like reference numerals refer to similar elements.

The reason why the polyethylene naphthalate film having the foregoing properties is used in the present invention will be described as follows.

If the polyethylene naphthalate film has an elastic modulus of less than 500 kg/mm$^2$ or a thermal expansion coefficient of more than $1.5 \times 10^{-5}$/° C., it cannot provide a good dimensional stability under high temperature conditions during the process for the production of printed circuit board and actual working. If the polyethylene naphthalate film has a hygroscopic expansion coefficient of more than $1.2 \times 10^{-5}$/%RH, a water vapor permeability of more than 15 g/m$^2$/mil·day or a percent water absorption of more than 2%, it cannot provide a good dimensional stability under high humidity conditions. If the polyethylene naphthalate film has a melting point of higher than 280° C., the separation of the substrate film from the conductor circuit by melting during the recycling of materials from waste printed circuit board requires a high energy and thus can be hardly effected.

With respect to the physical properties of the foregoing polyethylene naphthalate film, particularly preferred range of elastic modulus, thermal expansion coefficient and hygroscopic expansion coefficient are from 500 to 800 kg/mm$^2$, from 0.3 to $1.5 \times 10^{-5}$/° C. and from 0.8 to $1.2 \times 10^{-5}$/%RH, respectively.

An example of the polyethylene naphthalate film satisfying the foregoing requirements is KALADEX, produced by ICI.

General-purpose films such as polyethylene terephthalate film and polyimide film which have been heretofore used as substrate film in the prior art neither satisfy all the requirements nor provide the foregoing requirements of the printed circuit board.

For example, the polyethylene terephthalate film has an elastic modulus of from 400 to 500 kg/mm$^2$ and a linear thermal expansion coefficient of from 1.2 to $2.0 \times 10^{-5}$/° C., which deviate from the above defined range of physical properties of the present invention, and thus cannot provide a good dimensional stability under high temperature conditions.

The polyimide film has a hygroscopic expansion coefficient of from 2.0 to $2.5 \times 10^{-5}$/%RH, a water vapor permeability of from 40 to 50 g/m$^2$/mil·day and a percent water absorption of from 2.5 to 3.5%, which deviate from the above defined range of physical properties of the present invention, and thus provides a poor dimensional stability that causes dimensional failure under high humidity conditions. Further, since the polyimide film is a thermosetting resin, it cannot be melted at high temperatures. Therefore, when useful materials are recycled from waste printed circuit board, the separation of the substrate film from the circuit board by melting cannot be effected.

The circuit conductor constituting the printed circuit board according to the third embodiment of the present invention is not specifically limited. Similarly to the first and second embodiments of the present invention, the circuit conductor may be formed by a metal foil having a good electrical conductivity such as copper foil, aluminum foil and nichrome foil. The thickness of the metal foil is not limited specifically, and can be appropriately determined. If necessary, the surface of the metal foil may be plated with tin, solder, gold, nickel or the like.

As the adhesive to be used for the lamination of the substrate film with the circuit conductor there may be used the same adhesive as used in the first and second embodiments. Various adhesives such as nitrile rubber adhesive, polyamide adhesive, polyacrylic adhesive and polyester adhesive have heretofore been proposed and used.

In the third embodiment of the present invention, the foregoing general-purpose adhesives which have heretofore been used may be used. In general, however, the adhesive is properly selected depending on the kind of the substrate material to which it is applied. Extensive studies were made of optimum adhesive for the polyethylene naphthalate film of the present invention. As a result, it was found that an adhesive comprising the following ingredients (A) to (D) exhibits a strong adhesive strength with respect to the polyethylene naphthalate film.

As mentioned above, the adhesive comprising the following ingredients (A) to (D) may be preferably used also in the first and second embodiments of the present invention.

(A) Polyester resin;
(B) Novolak epoxy resin;
(C) Polyisocyanate compound; and
(D) Tertiary amine.

The foregoing polyester resin (ingredient (A)) can be synthesized by a known method, such as polycondensation of a polyol such as ethylene glycol, diethylene glycol, triethylene glycol, propylene glycol, neopentyl glycol, trimethylol propane and trimethylolpropane ethylene oxide adduct, with an acid component such as terephthalic acid, isophthalic acid, adipic acid, trimellitic acid, pyromellitic acid, sebacic acid and acid anhydride thereof. With respect to the molecular weight of the polyester resin (ingredient (A)), the weight-average molecular weight is preferably from 10,000 to 30,000, particularly from 20,000 to 25,000, as determined by GPC.

As the novolak epoxy resin to be used as the foregoing ingredient (B) there is preferably used a phenol novolak epoxy resin or cresol novolak epoxy resin. The novolak epoxy resin preferably exhibits an epoxy equivalent of from 300 to 320 g/eq and a melting point of from 65 to 75° C. The amount of the novolak epoxy resin to be incorporated as the ingredient (B) is preferably set to a range of from 50 to 150 parts by weight, particularly from 80 to 120 parts by weight based on 100 parts by weight of the polyester resin (ingredient (A)).

In order to further improve the adhesion between the substrate film and the circuit conductor, it is preferred that the novolak epoxy resin as the foregoing ingredient (B) be an epoxy resin containing at least three epoxy groups per molecule.

As the polyisocyanate compound (ingredient (C)) to be used with the foregoing ingredients (A) and (B) there may be used either an aromatic polyisocyanate compound or an aliphatic polyisocyanate compound. Preferred examples of the aromatic polyisocyanate compound include a polyisocyanate compound obtained from tolylene diisocyanate and a polyfunctional alcohol. Preferred examples of the aliphatic polyisocyanate compound include a hexamethylene diisocyanate compound. Further, a polyfunctional polyisocyanate compound such as isophorone diisocyanate trimmer compound is preferably used.

The amount of the foregoing polyisocyanate compound (ingredient (C)) to be incorporated is preferably set to a range of from 10 to 30 parts by weight based on 100 parts by weight of the foregoing polyester resin (ingredient (A)). In particular, if two kinds of compounds, i.e., hexamethylene diisocyanate and isophorone diisocyanate trimmer compound are used in combination as polyisocyanate compounds, the sum of the amount of the two kinds of compounds is preferably determined to the above defined range (from 10 to 30 parts by weight), and the amount of the hexamethylene diisocyanate compound and the isophorone diisocyanate trimmer compound to be incorporated are preferably set to a range of from 3 to 5 parts by weight and from 15 to 25 parts by weight based on 100 parts by weight of the polyester resin (ingredient (A)), respectively. In other words, if the amount of the ingredient (C) to be incorporated falls below 10 parts by weight, the resulting adhesive tends to exhibit a deteriorated chemical resistance. On the contrary, if the amount of the ingredient (C) to be incorporated exceeds 30 parts by weight, the resulting adhesive tends to exhibit a deteriorated adhesion to the polyethylene naphthalate film.

The tertiary amine (ingredient (D)) to be used with the foregoing ingredients (A) to (C) is not specifically limited. In particular, however, 1,8-diazabicyclo (5,4,0) undecene-7 (hereinafter referred to as "DBU") is preferably used. The amount of the tertiary amine (ingredient (D)) to be incorporated is preferably set to a range of from 0.1 to 0.5 parts by weight based on 100 parts by weight of the foregoing polyester resin (ingredient (A)).

As the foregoing adhesive there is preferably used one comprising the foregoing ingredients (A) to (D). In this case, the adhesive solution may be prepared by dissolving or dispersing the ingredients (A) to (D) and optionally other additives in a solvent such as methyl ethyl ketone and toluene with stirring in such a manner that the resulting solid resin concentration reaches 40 to 60%.

Electric and electronic apparatus comprising printed circuit boards need to use flame retardant printed circuit boards from the standpoint of safety.

In the third embodiment of the present invention, it is preferred that the adhesive comprising the foregoing ingredients (A) to (D) comprise a brominated novolak epoxy resin as the novolak epoxy resin (ingredient (B)) and comprise a flame retardant aid (ingredient (E)) to enhance the flame retardance of the resulting printed circuit board and enhance the adhesion of the adhesive after heat deterioration.

As the foregoing brominated novolak epoxy resin there is preferably used a brominated phenol novolak epoxy resin or brominated cresol novolak epoxy resin. The brominated novolak epoxy resin preferably exhibits an epoxy equivalent of from 300 to 320 g/eq and a melting point of from 65 to 75° C.

The amount of the brominated novolak epoxy resin to be incorporated is preferably set to a range of from 50 to 150 parts by weight, particularly from 80 to 120 parts by weight based on 100 parts by weight of the polyester resin (ingredient (A)). In other words, if the amount of the ingredient (B) to be incorporated falls below 50 parts by weight, the desired flame retardance can be hardly obtained. On the contrary, if the amount of the ingredient (B) to be incorporated exceeds 150 parts by weight, the resulting adhesive tends to exhibit deteriorated adhesion and heat resistance.

In order to further enhance the adhesion between the substrate film and the circuit conductor and the flame retardance of the laminate, it is preferred that the brominated novolak epoxy resin be an epoxy resin containing at least three epoxy groups per molecule and its bromine content be set to not less than 12% by weight based on the sum of the amount of the foregoing ingredients (A) to (E), particularly from 12 to 22%. In other words, if the bromine content falls below 12%, excellent flame retardance can hardly be obtained.

Examples of the foregoing flame retardant aid include antimony trioxide ($Sb_2O_3$), antimony pentoxide ($Sb_2O_5$), aluminum hydroxide [$Al(OH)_3$], and magnesium hydroxide [$Mg(OH)_2$]. These flame retardant aids may be used singly or in combination. In particular, antimony trioxide is preferably used. Antimony trioxide having a small grain diameter (e.g., not more than 5 $\mu$m) is particularly desirable. Alternatively, the particulate flame retardant aids treated with a coupling agent such as silicone-based coupling agent and titanate-based coupling agent may be used.

The amount of the foregoing flame retardant aid (ingredient (E)) to be incorporated is preferably set to a range of from 20 to 35 parts by weight based on 100 parts by weight of the foregoing polyester resin (ingredient (A)) or not less than 10% based on the total weight of the foregoing ingredients (A) to (E). In other words, if the amount of the ingredient (E) to be incorporated falls below 20 parts by weight, the resulting adhesive tends to exhibit a deteriorated flame retardance. On the contrary, if the amount of the ingredient (E) to be incorporated exceeds 35 parts by weight, the resulting adhesive tends to exhibit deteriorated adhesion and flexibility.

The use of the foregoing adhesive comprising such a flame retardant aid makes it possible to provide the printed circuit board with a high flame retardance (UL-94-VTM-0) which is not possessed by the polyethylene naphthalate film as substrate film.

The foregoing adhesive may properly comprise ordinary additives such as silane coupling agent as adhesion improver, inorganic filler, oxidation inhibitor, heat stabilizer, ultraviolet absorber, lubricant, releasing agent and coloring agent (e.g., dye, pigment) incorporated therein as necessary besides the foregoing ingredients (A) to (E).

The printed circuit board according to the third embodiment of the present invention is obtained by integrating the polyethylene naphthalate film having the foregoing specific physical properties and the circuit conductor with an adhesive into a laminate. For example, the following method may be used. In some detail, a solution of an adhesive in a solvent such as methyl ethyl ketone and toluene is applied to the surface of a polyethylene naphthalate film or metal foil by means of a reverse-roll coater, comma coater or the like to a dry thickness of from 10 to 50 $\mu$m. The coated material is then dried at a temperature of from 50° C. to 150° C. for 1 to 10 minutes so that the solvent is evaporated away to prepare a polyethylene naphthalate film or metal foil having formed thereon an adhesive layer being at a B-stage.

Subsequently, a metal foil (or a polyethylene naphthalate film) is contact-bonded to the adhesive layer side of the foregoing polyethylene naphthalate film (or metal foil) having an adhesive layer formed thereon under heating by a batch press method or continuous roll lamination process, optionally followed by postcuring, to prepare a printed circuit substrate (unpatterned printed circuit board).

The foregoing continuous lamination method is preferably effected at a temperature of from 80° C. to 120° C., linear pressure of from 1 to 50 kg/mm and a rate of from 1 to 10 m/min. The foregoing postcuring is preferably effected at a temperature of from 80° C. to 120° C. for 1 to 24 hours.

Subsequently, the metal foil is subjected to a known treatment such as printing method, subtractive method and additive method to form a circuit pattern thereon. Thus, a conductor circuit is prepared. At this time, a printed circuit board has been prepared. In general, however, the same substrate film as used above is then stuck to the conductor circuit as a cover lay film with an adhesive.

In this case, the polyethylene naphthalate film with an adhesive obtained by the method mentioned above is contact-bonded to the conductor circuit as a cover lay film under heating. The conditions of the heat contact-bonding, if effected by a batch press method, are preferably set to a temperature of from 80° C. to 150° C., a pressure of from 20 to 100 kg/cm$^2$ and a period of from 1 to 60 minutes.

In the printed circuit board according to the third embodiment of the present invention, the circuit member according to the first embodiment of the present invention can be preferably used.

The first, second and third embodiments of the present invention will be further described in the following examples, but the present invention should not be construed as being limited thereto.

The following Examples 1 and 2 and Comparative Examples 1 and 2 concern the first embodiment of the present invention.

EXAMPLE 1

A nickel plate having a thickness of 100 $\mu$m was subjected to punching on a mold in a predetermined pattern to obtain a circuit conductor.

Holes for soldering electronic parts were made in a polyethylene naphthalate film having a thickness of 25 $\mu$m (KALADEX, produced by ICI). An adhesive layer having a thickness of 25 $\mu$m, which was made from a polyester and an isocyanate, was then provided on one side of the polyethylene naphthalate film. The circuit conductor which had been cleaned with a detergent was then interposed between two sheets of the polyethylene naphthalate films with an adhesive. Lamination was effected under a heat press of 30 kg at a temperature of 160° C. for 60 minutes. The laminate was then bent into a predetermined shape under a press to obtain a rigid circuit member.

With respect to the bent shape and dimension of the laminate, the size a, b, c, d and e were 5 mm, 50 mm, 10 mm, 50 mm and 5 mm, respectively, as shown in FIG. 1.

EXAMPLE 2

A copper plate having a thickness of 35 $\mu$m was stuck to one side of the same polyethylene naphthalate film as used in Example 1 with the same adhesive as used in Example 1 under a heat press (thickness of adhesive layer: 25 $\mu$m; heat press condition: 160° C.×30 kg/cm×60 minutes) in the same manner as in Example 1. An etching resist was then formed on the copper plate. The copper plate was then etched with an etching solution to form a circuit conductor having the same pattern as in Example 1. Holes for soldering electronic parts were then made in the same polyethylene naphthalate film having a thickness of 25 μm as used in Example 1. An adhesive layer having a thickness of 25 μm made of a polyester and an isocyanate was then provided on one side of the polyethylene naphthalate film. The polyethylene naphthalate film with an adhesive layer was then heat-pressed onto the foregoing circuit conductor in the same manner as in Example 1. The laminate was then bent into a predetermined shape under a press in the same manner as in Example 1 to obtain a rigid circuit member.

Comparative Example 1

The procedure of Example 1 was followed except that the polyethylene naphthalate film was replaced by a polyimide film having a thickness of 25 μm (KAPTON H, produced by Du Pont) and an adhesive comprising an epoxy resin, an acrylonitrile-butadiene rubber and a phenol resin was used as the adhesive.

Comparative Example 2

The procedure of Example 1 was followed except that the polyethylene naphthalate film was replaced by a polyethylene terephthalate film having a thickness of 25 μm (MELINEX, produced by ICI).

The products of these examples and comparative examples were then measured for thermal shrinkage rate after ageing at a temperature of 80° C. for 1,000 hours. The results are set forth in Table 1.

Table 1 al so shows the occurrence of damage on these products during b ending and the shape retention thereof after bending.

TABLE 1

|  | Example 1 | Example 2 | Comparative Example 1 | Comparative Example 2 |
| --- | --- | --- | --- | --- |
| % Dimensional Shrinkage | 0.04% | 0.05% | 0.10% | 0.35% |
| Occurrence of Damage on Film During Press Molding | None | None | Many breaks | None |
| Shape Retention After Press Molding | Stable, no deformation | Stable, no deformation | Conductor often bends due to its weight | Stable, no deformation |

As evident from the test results of Comparative Example 1, the product comprising a polyethylene terephthalate film as a plastic film exhibited a relatively low thermal shrinkage rate and thus can be expected to show some reliability against severe thermal working atmosphere but exhibited a high percent failure during press molding and hence a deteriorated shape retention. On the other hand, as evident from the test results of Comparative Example 2, the product comprising a polyimide film as a plastic film exhibited a good yield during press molding and a good shape retention but showed a high thermal shrinkage rate and hence an insufficient reliability against severe thermal working atmosphere.

On the contrary, as evident from the test results of Examples 1 and 2, the circuit member according to the present invention exhibits a good yield during press molding, a good shape retention and a low thermal shrinkage rate and thus can be expected to show an excellent reliability against severe thermal working atmosphere.

The following Examples 3 and 4 and Comparative Examples 3 and 4 concern the second embodiment of the present invention.

EXAMPLE 3

A nickel plate having a thickness of 100 μm was subjected to punching on a mold in a predetermined pattern to obtain a circuit conductor.

An adhesive layer having a thickness of 25 μm, which was made from a polyester and an isocyanate, was then provided on one side of a polyethylene naphthalate film having a thickness of 25 μm (KALADEX, produced by ICI). The circuit conductor which had been cleaned with a detergent was then interposed between two sheets of the polyethylene naphthalate films with an adhesive. Lamination was effected under a heat press of 30 kg/cm at a temperature of 160° C. for 60 minutes to obtain a circuit board.

EXAMPLE 4

A copper plate having a thickness of 35 μm was stuck to one side of the same polyethylene naphthalate film as used in Example 3 with the same adhesive as used in Example 3 under a heat press (thickness of adhesive layer: 25 μm; heat press condition: 160° C.×30 kg/cm×60 minutes) in the same manner as in Example 3. An etching resist was then formed on the copper plate. The copper plate was then etched with an etching solution to form a circuit conductor having the same pattern as in Example 3. An adhesive layer having a thickness of 25 μm, which was made of a polyester and an isocyanate, was then provided on one side of the same polyethylene naphthalate film as used in Example 3. The polyethylene naphthalate film with an adhesive layer was then heat-pressed onto the foregoing circuit conductor in the same manner as in Example 3 to obtain a circuit board.

Comparative Example 3

The procedure of Example 3 was followed except that the polyethylene naphthalate film was replaced by a polyethylene terephthalate film having a thickness of 25 μm (MELINEX, produced by ICI).

Comparative Example 4

The procedure of Example 3 was followed except that the polyethylene naphthalate film was replaced by a polyimide film having a thickness of 25 μm (KAPTON H, produced by Du Pont) and an adhesive comprising an epoxy resin, an acrylonitrile-butadiene rubber and a phenol resin was used as the adhesive.

The products of Examples 3 and 4 and Comparative Examples 3 and 4 were then aged at a temperature of 80° C. for 1,000 hours. These products were then measured for dimensional shrinkage rate. Separately, the products of Examples 3 and 4 and Comparative Examples 3 and 4 were dipped in water and then aged at a temperature of 23° C. and a humidity of 60%RH for 12 hours. These products were then measured for dimensional shrinkage rate as well. The results are set forth in Table 2.

TABLE 2

|  | Example 3 | Example 4 | Comparative Example 3 | Comparative Example 4 |
| --- | --- | --- | --- | --- |
| Dimensional Shrinkage Rate After 80° C. × 1000 hr Ageing | 0.05% | 0.05% | 0.35% | 0.10% |
| Dimensional Shrinkage Rate After Dipping | 0.04% | 0.04% | 0.04% | 0.10% |

TABLE 2-continued

|  | Example 3 | Example 4 | Comparative Example 3 | Comparative Example 4 |
| --- | --- | --- | --- | --- |
| in water and 23° C. × 60% RH × 12 hr Aging | | | | |

As evident from the measurements of Comparative Example 4, the product comprising a polyimide film as a plastic film exhibited a relatively low thermal shrinkage rate and thus can be expected to show a good reliability in the connecting portion against thermal stress but exhibited a high drying shrinkage rate and thus cannot be expected to show a good reliability in the connecting portion against stress caused by moisture absorption and drying.

As evident from the measurements of Comparative Example 3, the product comprising a polyethylene terephthalate film as a plastic film exhibited a relatively low drying shrinkage rate and thus can be expected to show a good reliability in the connecting portion against stress caused by moisture absorption and drying but exhibited a high thermal shrinkage rate and thus cannot be expected to show a good reliability in the connecting portion against thermal stress.

On the contrary, as evident from the measurements of Examples 3 and 4, the circuit board according to the present invention exhibits low drying thermal shrinkage rate and thermal shrinkage rate and thus can be expected to show a good reliability in the connecting portion against stress caused by moisture absorption and drying as well as thermal stress, and show assured reliability even against severe humid and thermal working atmosphere.

The following Examples 5 to 7 and Comparative Examples 5 and 6 concern the third embodiment of the present invention.

EXAMPLE 5

100 parts by weight of a polyester resin (weight-average molecular weight: 23,000), 100 parts by weight of a brominated phenol novolak epoxy resin (epoxy equivalent: 310 g/eq; bromine content: 45%; melting point: 70° C.), 20 parts by weight of an isophorone diisocyanurate trimmer compound as a polyisocyanate compound, 4 parts by weight of hexamethylene diisocyanate, and 0.25 parts by weight of DBU were dissolved and dispersed in 224 parts by weight of methyl ethyl ketone with stirring to prepare an adhesive solution having a solid content concentration of 50% for printed circuit board.

Subsequently, the foregoing adhesive solution was applied to the surface of a polyethylene naphthalate film having a thickness of 25 $\mu$m (elastic modulus: 600 kg/mm$^2$; thermal expansion coefficient: 1.3×10$^{-5}$/° C.; hygroscopic expansion coefficient: 1.0×10$^{-5}$/%RH; water vapor permeability: 9.5 g/m$^2$/mil·day; percent water absorption: 2.0%; melting point: 262° C.) as a substrate film by means of a reverse-roll coater to provide a dry thickness of 25 $\mu$m. The coated material was then dried in a 100° C. hot air circulating dryer for 3 minutes to obtain a polyethylene naphthalate film having an adhesive layer formed thereon.

Thereafter, the polyethylene naphthalate film and a rolled copper foil having a thickness of 35 $\mu$m were laminated in such an arrangement that the adhesive layer side of the polyethylene naphthalate film and the treated side (e.g., nickel-copper alloy-treated side) of the copper foil were opposed to each other. The laminate was then subjected to contact bonding at a temperature of 150° C. and a pressure of 30 kg/cm$^2$ under a heat press for 60 minutes to obtain an unpatterned printed circuit board intermediate.

Thereafter, an etching resist was formed on the copper foil by a photomask method. The copper foil was then etched with an etching solution to dissolve unnecessary area away and form a predetermined circuit pattern. Thus, a conductor circuit was prepared.

A polyethylene naphthalate film having an adhesive layer formed thereon to be stuck to the conductor circuit was then prepared in the same manner as mentioned above. The substrate film and the copper foil were then laminated in such an arrangement that the adhesive layer side of the substrate film and the conductor circuit side of the copper foil were opposed to each other. The laminate was then subjected to contact bonding at a temperature of 150° C. and a pressure of 30 kg/cm$^2$ under a heat press for 60 minutes to obtain a desired printed circuit board.

EXAMPLE 6

A printed circuit board was prepared in the same manner as in Example 5 except that the adhesive for printed circuit board was prepared in the manner as mentioned below.

100 parts by weight of a polyester resin (weight-average molecular weight: 23,000), 100 parts by weight of a brominated phenol novolak epoxy resin (epoxy equivalent: 310 g/eq; bromine content: 45%; melting point: 70° C.), 20 parts by weight of an isophorone diisocyanurate trimmer compound as a polyisocyanate compound, 4 parts by weight of hexamethylene diisocyanate, 0.25 parts by weight of DBU, and 25 parts by weight of antimony trioxide were dissolved and dispersed in 249 parts by weight of methyl ethyl ketone to prepare an adhesive solution having a solid content concentration of 50% for printed circuit board.

EXAMPLE 7

A printed circuit board was prepared in the same manner as in Example 6 except that the adhesive solution for printed circuit board was prepared as follows. In some detail, the content of the brominated novolak epoxy resin, the isophorone diisocyanurate trimmer compound, hexamethylene diisocyanate, DBU, antimony trioxide (surface-treated with a titanate-based coupling agent) and methyl ethyl ketone were changed to 50 parts by weight, 15 parts by weight, 3 parts by weight, 0.1 parts by weight, 20 parts by weight, and 188 parts by weight, respectively.

Comparative Example 5

A printed circuit board was prepared in the same manner as in Example 6 except that as the substrate film there was used a polyethylene terephthalate film having a thickness of 25 $\mu$m (MELINEX, produced by ICI; elastic modulus: 450 kg/mm$^2$; thermal expansion coefficient: 1.5×10$^{-5}$/° C.; hygroscopic expansion coefficient: 1.0×10$^{-5}$/%RH; water vapor permeability: 25 g/m$^2$/mil·day; percent water absorption: 2%; melting point: 256° C.).

Comparative Example 6

A printed circuit board was prepared in the same manner as in Example 6 except that as the substrate film there was used a polyimide film having a thickness of 25 $\mu$m (KAPTONH, produced by DuPont; elastic modulus: 350 kg/mm$^2$; thermal expansion coefficient: 2.6×10$^{-5}$/° C.; hygroscopic expansion coefficient: 2.2×10$^{-5}$/%RH; water vapor permeability: 50 g/m$^2$/mil·day; percent water absorption: 3.0%).

The printed circuit boards of examples and comparative examples thus obtained were then evaluated for various properties. The evaluation results of these products are set forth in Table 3.

TABLE 3

|  | Example 5 | Example 6 | Example 7 | Comparative Example 5 | Comparative Example 6 |
|---|---|---|---|---|---|
| % Dimensional Shrinkage Rate (80° C. × 1000 hr) (Heat Resistance) | 0.05 | 0.05 | 0.05 | 0.35 | 0.10 |
| Dimensional Stability Under High Humidity Conditions (40° C. × 90%) | Good | Good | Good | Good | Poor |
| Recyclability of Material | Good | Good | Good | Good | Poor |
| Flame Retardance | VYM-2 | VTM-0 | VTM-0 | VTM-0 | VTM-0 |

Dimensional Shrinkage Rate

The test was effected in accordance with IPC-TM-650.

Flame Retardance

The test was effected in accordance with UL-94.

The results in Table 3 show that Examples 5, 6 and 7 exhibit a low thermal shrinkage rate under high temperature conditions and an excellent dimensional stability as compared with Comparative Examples 5 and 6.

Comparative Example 6, which comprises a polyimide film as a substrate film, exhibits a deteriorated dimensional stability under high humidity conditions as compared with Examples 5, 6 and 7.

In all Examples 5 to 7, the conductor circuit and the substrate film could be separated from each other by heating and melting the substrate film. On the contrary, in Comparative Example 6, which comprises a polyimide film as a substrate film, the conductor circuit and the substrate film could not be separated from each other, making it impossible to recycle the materials.

Industrial Utilization Possibility

The first embodiment of the present invention makes the best use of high elastic modulus and low thermal shrinkage rate of a polyethylene naphthalate film to satisfy the requirements for press-moldability, self-shape retention and reliability against severe thermal working conditions under the circumstances that there are two opposing demands, i.e., necessity of using a high elastic modulus plastic film for a self-shape retaining circuit member obtained by bending a laminated composite comprising a circuit conductor made of a metal foil interposed between plastic films with an adhesive under a press from the standpoint of press-moldability and self-shape retention and necessity of using a low elastic modulus plastic film for such a circuit member from the standpoint of reliability against severe thermal working conditions.

Accordingly, the first embodiment of the present invention can provide a self-shape retaining rigid circuit member excellent both in productivity and reliability.

The circuit board according to the second embodiment of the present invention comprises a polyethylene naphthalate film as a substrate and a covering material taking into account the fact that, in a plastic circuit board adapted to be superposed on and connected to the end of a circuit board having substantially zero hygroscopic and drying expansion and shrinkage rate such as glass substrate circuit board, not only thermal expansion and shrinkage rate but also hygroscopic and drying expansion and shrinkage rate take great part in fatigue and damage on the connecting portion due to stress, and thus can exhibit assured excellent reliability even under severe humid and thermal working conditions.

Further, the printed circuit according to the third embodiment of the present invention is obtained by integrating a polyethylene naphthalate film as a substrate film and a conductor circuit with an adhesive into a laminate. Since the elastic modulus, thermal expansion coefficient, hygroscopic expansion coefficient, water vapor permeability, percent water absorption and melting point of the polyethylene naphthalate film are restricted to a specific range, it gives a good dimensional stability during the production of printed circuit board and actual use even under high temperature and humidity conditions, and the conductor circuit can be easily separated by heating and melting the substrate film when the materials are recycled from waste printed circuit board.

Moreover, the printed circuit board obtained by integrating the foregoing polyethylene naphthalate film and conductor circuit into a laminate with an adhesive comprising the foregoing ingredients (A) to (E) (ingredient (B) is a brominated novolak epoxy resin) exhibits a high flame retardance (UL-94-VTM-0) that is inherently not possessed by polyethylene naphthalate film and thus is very desirable for the enhancement of safety of electric and electronic apparatus.

What is claimed is:

1. A rigid circuit member obtained by bending a composite laminate into a predetermined shape, the rigid circuit member comprising a circuit conductor made of a metal foil and interposed between plastic films having an elastic modulus ranging from about 450 kg/mm$^2$ to about 550 kg/mm$^2$, a thermal expansion coefficient of not more than 1.5×10$^{-5}$/°C., a hygroscopic expansions coefficient of not more than 1.2×10$^{-5}$/%RH, and a water vapor permeability of not more than 15 g/m$^2$/mil day with an adhesive, wherein a polyethylene naphthalate film is used as the plastic film and wherein the rigid circuit member substantially retains the predetermined shape.

2. A circuit board connected to a conductor on a rigid substrate, the circuit board comprising a circuit conductor being interposed between polyethylene naphthalate films wherein the polyethylene naphthalate films have an elastic modulus ranging from about 450 kg/mm$^2$ to about 550 kg/mm$^2$, a thermal expansion coefficient of not more than 1.5×10$^{-5}$/° C., a hygroscopic expansions coefficient of not more than 1.2×10$^{-5}$/%RH, a water vapor permeability of not more than 15 g/m$^2$/mil day.

3. A circuit board connected to a conductor on a rigid substrate, the circuit board comprising a circuit conductor being interposed between polyethylene naphthalate films wherein said rigid substrate is a glass substrate having a transparent electrode provided thereon.

4. A printed circuit board comprising a polyethylene naphthalate film having an elastic modulus ranging from about 500 kg/mm$^2$ to about 800 kg/mm$^2$, a thermal expansion coefficient of ranging from about 0.3×10$^{-5}$/° C. to about 1.5×10$^{-5}$/° C., a hygroscopic expansions coefficient ranging from about 0.8×10$^{-5}$/%RH to about 1.2×10$^{-5}$/%RH, a water vapor permeability of not more than 15 g/m$^2$/mil day, a percent water absorption of not more than 2% and a melting point of not higher than 280° C. and a conductor circuit, which are integrated into a laminate with an adhesive layer provided interposed therebetween.

5. The printed circuit board according to claim 4, wherein said adhesive comprises the following ingredients (A) to (D):

(A) Polyester resin;

(B) Novolak epoxy resin;

(C) Polyisocyante compound; and (D) Tertiary amine.

6. A printed circuit board comprising a polyethylene naphthalate film having an elastic modulus of not less than 500 kg/mm$^2$, a thermal expansion coefficient of not more than $1.5 \times 10^{-5}$/° C., a hygroscopic expansions coefficient of not more than $1.2 \times 10^{-5}$/%RH, a water vapor permeability of not more than 15 g/m$^2$/mil day, a percent water absorption of not more than 2% and a melting point of not higher than 280° C. and a conductor circuit which are integrated into a laminate with an adhesive layer provided interposed therebetween, wherein said adhesive comprises the following ingredients (A) to (E):

(A) a polyester resin;

(B) a novolak epoxy resin;

(C) a polyisocyanate compound;

(D) a tertiary amine; and (E) a flame retardant aid, wherein said novolak epoxy resin is a brominated novolak epoxy resin.

7. The printed circuit board according to claim 6, wherein said brominated novolak epoxy resin is an epoxy resin containing at least three groups per molecule based on the total weight of said ingredients (A) to (E).

* * * * *